US010699774B2

(12) United States Patent
Ho et al.

(10) Patent No.: US 10,699,774 B2
(45) Date of Patent: *Jun. 30, 2020

(54) MITIGATING LINE-TO-LINE CAPACITIVE COUPLING IN A MEMORY DIE

(71) Applicant: Micron Technology, Inc., Boise, ID (US)

(72) Inventors: Michael V. Ho, Allen, TX (US); Scott E. Smith, Plano, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/189,434

(22) Filed: Nov. 13, 2018

(65) Prior Publication Data

US 2019/0108869 A1    Apr. 11, 2019

Related U.S. Application Data

(63) Continuation of application No. 15/686,996, filed on Aug. 25, 2017, now Pat. No. 10,157,661.

(51) Int. Cl.
*G11C 11/24* (2006.01)
*G11C 11/4096* (2006.01)
(Continued)

(52) U.S. Cl.
CPC .......... *G11C 11/4096* (2013.01); *G11C 7/02* (2013.01); *G11C 7/1048* (2013.01);
(Continued)

(58) Field of Classification Search
CPC .......... G11C 29/023; G11C 29/022; G11C 29/50012; G11C 29/028; G11C 7/22; G11C 5/04; G11C 11/4076; G11C 11/409; G11C 11/4096; G11C 29/02; G11C 29/50008; G11C 5/063; G11C 7/04
(Continued)

(56) References Cited

U.S. PATENT DOCUMENTS 6,094,375 A    7/2000  Lee
7,652,949 B2   1/2010  Yoon et al.
(Continued)

OTHER PUBLICATIONS

ISA/KR, International Search Report and Written Opinion of the International Searching Authority, Int'l. Appl. No. PCT/US2018/047335, dated Dec. 14, 2018, Korean Intellectual Property Office, Seo-gu, Daejeon, Republic of Korea, 16 pgs.

*Primary Examiner* — Thong Q Le
(74) *Attorney, Agent, or Firm* — Holland & Hart LLP

(57) ABSTRACT

Methods, systems, and devices for mitigating line-to-line capacitive coupling in a memory die are described. A device may include multiple drivers configured to both drive latched data and conduct read and write operations. For example, a memory device may contain two or more memory arrays independently coupled to two drivers via two data lines. One data line may be driven strongly to shield a corresponding memory array from effects associated with data line capacitive coupling. An opposing data line may be driven with data pertaining to an access operation of the memory array to which it is coupled. The opposing data line may be driven concurrently or within a small time difference of the other data line.

20 Claims, 9 Drawing Sheets

(51) Int. Cl.
*G11C 11/408* (2006.01)
*G11C 11/22* (2006.01)
*G11C 11/4094* (2006.01)
*G11C 11/4091* (2006.01)
*G11C 7/10* (2006.01)
*G11C 7/02* (2006.01)
*G11C 11/4097* (2006.01)
*G11C 7/18* (2006.01)

(52) U.S. Cl.
CPC ........ *G11C 11/221* (2013.01); *G11C 11/2253* (2013.01); *G11C 11/2255* (2013.01); *G11C 11/2273* (2013.01); *G11C 11/2293* (2013.01); *G11C 11/4085* (2013.01); *G11C 11/4091* (2013.01); *G11C 11/4094* (2013.01); *G11C 7/1096* (2013.01); *G11C 7/18* (2013.01); *G11C 11/4097* (2013.01); *G11C 2207/107* (2013.01)

(58) Field of Classification Search
USPC ... 365/189.05, 193, 194, 185.11, 233.1, 129, 365/149, 185.22, 185.24, 189.011, 365/189.14, 189.16, 230.06, 233.11
See application file for complete search history.

(56) References Cited

U.S. PATENT DOCUMENTS

| | | |
|---|---|---|
| 8,004,897 B2 | 8/2011 | Doyle |
| 8,214,616 B2 | 7/2012 | Ware et al. |
| 8,792,262 B2 | 7/2014 | Tailliet |
| 9,570,122 B2 | 2/2017 | Fujisawa |
| 10,157,661 B1 * | 12/2018 | Ho ..................... G11C 11/2293 |
| 2015/0310904 A1 | 10/2015 | Kim et al. |

* cited by examiner

MITIGATING LINE-TO-LINE CAPACITIVE COUPLING IN A MEMORY DIE

CROSS REFERENCE

The present Application for Patent is a continuation of U.S. patent application Ser. No. 15/686,996, by Ho et al., entitled "Mitigating Line-to-Line Capacitive Coupling In A Memory Die," filed Aug. 25, 2017, assigned to the assignee hereof, and is expressly incorporated by reference in its entirety herein.

BACKGROUND

The following relates generally to memory array and more specifically to mitigating line-to-line capacitive coupling in a memory die.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, reducing memory die size, increasing read/write speeds, increasing reliability, increasing data retention, reducing power consumption, or reducing manufacturing costs, among other metrics. However, as memory die sizes decrease, the potential for capacitive coupling effects between data lines increases.

DETAILED DESCRIPTION

A memory die that supports single-center architecture may provide for reduced die size, minimal or reduced capacitive coupling effects between data lines, and reduced power consumption in memory applications that may benefit from layout efficiency. For example, a device may employ two memory arrays, each coupled to a data line that is located in a same plane and electrically isolated from the other. One data line may conduct a read or write operation while the opposing data line is driven strongly to shield the opposing data line from capacitive coupling effects associated with the length of the line. The strongly-driven line may be driven with a previous data state, stored to a latch circuit.

By way of example, the memory device may contain two memory arrays, each coupled to a driver via a data line. The drivers may be further-coupled to a separate latch circuit. A first data line may be driven with data from at least one memory cell of one memory array. For example, the data line may be driven with data written to or data read from the memory cell. A second data line may be concurrently driven with data stored in a latch circuit coupled to the line. The data may be a previously-stored data state and may shield the opposing data line from any capacitive coupling effects arising from the architecture.

In some examples, both the first and second data lines may be driven in response to a first command. The first command may indicate either a read or a write operation to one or more memory cells of the first array. After the read or write operation is conducted, this data may be stored to a second latch circuit coupled to the array. A second command may be subsequently issued to reverse the operation—to conduct a read or write operation via the second data line and drive latched data via the first data line. Like the first command, the second command may indicate either a read or a write operation to one or more memory cells of the second array. Regardless of the order in which the commands are issued, the commands may be offset in time to ensure proper shielding occurs.

Features of the disclosure introduced above are further described below in the context of a memory array and corresponding support circuitry. Specific examples are then described for FIGS. 2-8 in the context of a memory array and corresponding support circuitry, timing diagrams, and a flowchart. These and other features of the disclosure are further illustrated by and described with reference to apparatus diagrams, timing diagrams, and flowcharts that relate to mitigating line-to-line capacitive coupling in a memory die.

Figure 1:
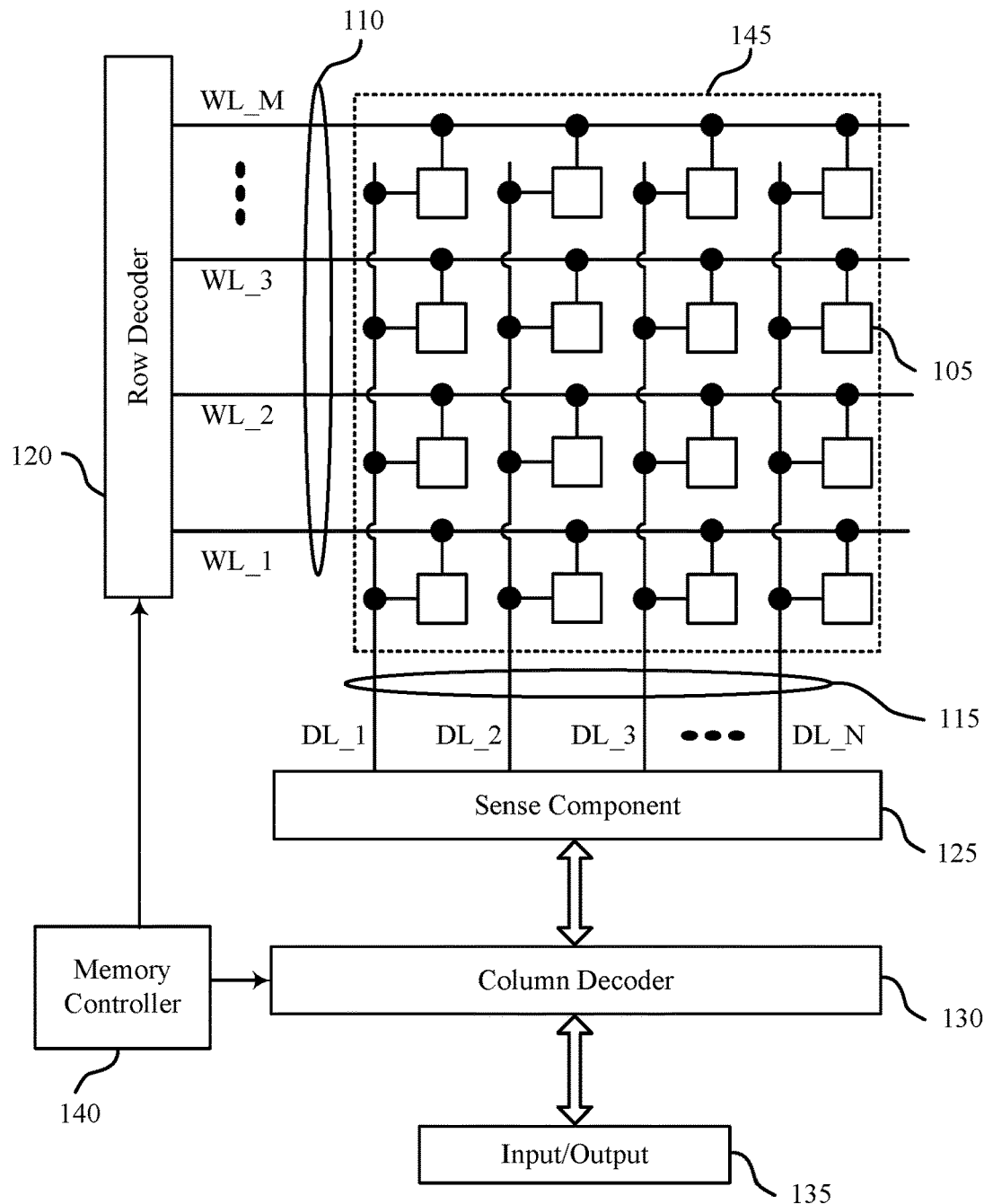
FIG. 1 illustrates an exemplary memory device that supports mitigating line-to-line capacitive coupling in a memory die in accordance with examples of the present disclosure.

FIG. 1 illustrates an example memory device 100 in accordance with various examples of the present disclosure. Memory device 100 may be referred to as an electronic memory apparatus and may contain memory array 145. Memory array 145 may be an example of one or more memory arrays that support mitigating line-to-line capacitive coupling in memory die. Memory array 145 may include memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may use such a design, and the capacitor employed may include a dielectric material with linear or para-electric electric polarization properties as the insulator. Or in some examples, a ferroelectric memory cell may include a capacitor with a ferroelectric as the insulating material.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 may be connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 145 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 145 may include any number of levels. Each level may be aligned or positioned so that memory cells 105 may be approximately aligned with one another across each level.

Each row of memory cells 105 may be connected to a single word line 110, and each column of memory cells 105 may be connected to a single digit line 115. In the example depicted in FIG. 1, memory array 145 includes one level of memory cells 105 and may thus be considered a two-dimensional memory array; however, the number of levels is not limited. By activating one word line 110 and one digit line 115 (e.g., applying a voltage to the word line 110 or digit line 115), a single memory cell 105 may be accessed at their intersection. Additionally, for example, in a 3D memory array, each level in a row may have common conductive lines such that each level may share word lines 110 or digit lines 115 or contain separate word lines 110 or digit lines 115. Thus in a 3D configuration one word line 110 and one digit line 115 of a same level may be activated to access a single memory cell 105 at their intersection. The intersection of a word line 110 and digit line 115, in either a 2D or 3D configuration, may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 145 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In some examples, memory array 145 may be coupled to a data line (not illustrated). The data line may be coupled to a driver and may drive data to and from at least one memory cell 105 of memory array 145. In some examples, the data line may be coupled to a driver to drive data to and from at least one memory cell 105 of memory array 145 in response to a command indicating an access to memory array 145. The driver may be configured to drive the data line with data read from or written to at least one memory cell 105 in response to the command.

Upon accessing a memory cell 105, the memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100.

In some examples, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory device 100. For example, memory controller 140 may drive a data line coupled to memory array 145 with data read from at least one memory cell 105. In some examples, the data may be written to memory cell 105. This operation may be conducted by memory controller 140 in response to a command indicating an access to memory array 145. Additionally or alternatively, for example, memory controller 140 may be operable to drive the data line with data stored in a first latch circuit (not illustrated) in response to the command indicating an access to memory array 145. Furthermore, one, multiple, or all memory cells 105 within memory array 145 may be accessed simultaneously; for example, multiple or all cells of memory array 145 may be accessed simultaneously during a reset operation in which all memory cells 105, or a group of memory cells 105, are set to a single logic state.

Figure 2:
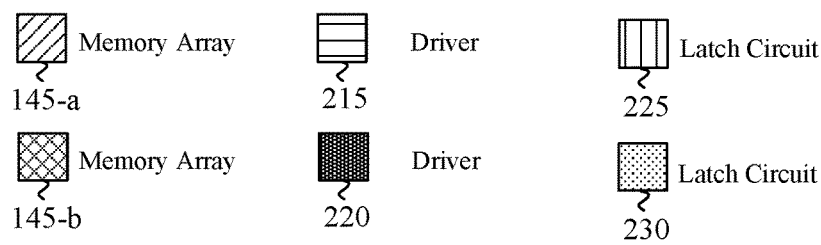
FIG. 2 illustrates an exemplary memory device that supports mitigating line-to-line capacitive coupling in a memory die in accordance with examples of the present disclosure.
Figure 2:
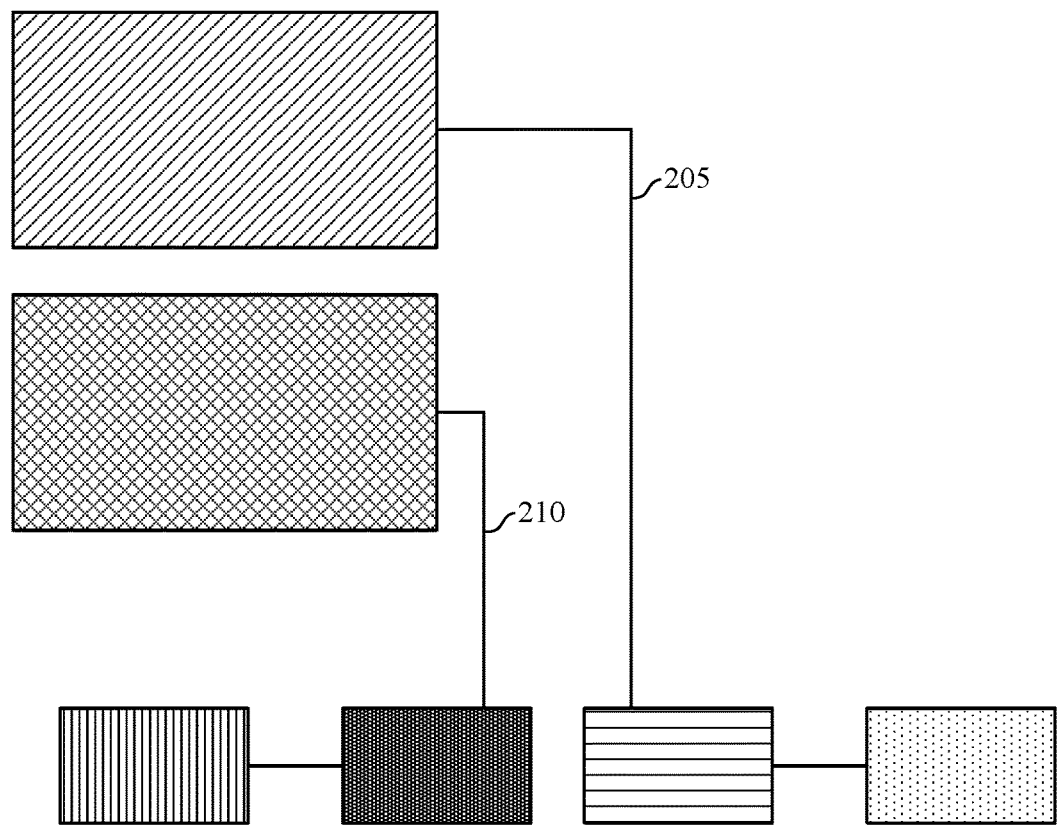

FIG. 2 illustrates an example memory device 200 in accordance with various examples of the present disclosure. Memory device 200 may include memory array 145-a, memory array 145-b, data line 205, data line 210, driver 215, driver 220, latch circuit 225, and latch circuit 230. Memory arrays 145-a and 145-b may be examples of one or more memory arrays that support mitigating line-to-line capacitive coupling in memory die. In some examples, memory arrays 145-a and 145-b may be referred to as a first memory array and a second memory array, respectively, and may be examples of memory array 145 as described with reference to FIG. 1.

In some examples, first data line 205 may be coupled to first memory array 145-a and to a first driver 215 and second data line 210 may be coupled to second memory array 145-b and to a second driver 220. Data lines 205 and 210 may extend in a same plane and may be referred to as a first data line and a second data line, respectively, and may be examples of the data line as described with reference to FIG. 1. Similarly, drivers 215 and 220 may be referred to as a first driver and a second driver, respectively, and may be examples of the driver as described with reference to FIG. 1. In some examples, each of data lines 205 and 210 may represent multiple data lines. For example, each of data lines 205 and 250 may contain 144 total data lines. For example, 72 of the 144 data lines may be configured to be activated (e.g., driven) by read or write operations and the remaining 72 of the 144 data lines may be configured to drive latched data.

The first driver 215 may be coupled to a second latch circuit 230 and the second driver 220 may be coupled to a first latch circuit 225. Latch circuits 225 and 230 may be referred to as first latch circuit and second latch circuit, respectively, and may be examples of the latch circuit as described with reference to FIG. 1. Both the first data line 205 and second data line 210 may be configured such that they are extending in a same plane and are electrically isolated from each other. For example, first data line 205 may be electrically isolated from second memory array 145-b and second data line 210 may be electrically isolated from first memory array 145-a.

The first driver 215 may be configured to drive the first data line 205 with first data that may be read from at least one memory cell (e.g., memory cell 105 as described with reference to FIG. 1) of the first memory array 145-a. In some examples, the first data may be written to at least one memory cell of the first memory array 145-a. Additionally or alternatively, for example, the second driver 220 may be configured to drive second data from at least one memory cell (e.g., memory cell 105 as described with reference to FIG. 1) of the second memory array 145-b in response to a first command, which may indicate an access to the first memory array 145-a. In some examples, the first driver 215 may be configured to drive the first data line 205 with first data in response to the first command. The first command may be, for example, a command to read from or write to at least one memory cell of the first memory array 145-a.

In some examples, the second driver 220 may be configured to drive the second data line 210 with second data read from or written to at least one memory cell of the second memory array 145-b. In other examples, the second driver 220 may be configured to drive the second data line 210 with second data based at least in part on a difference in timing between the first command and the second command.

In either instance, the second driver 220 may drive second data in response to a second command, which may be, for example, a command to read from or write to at least one memory cell of the second memory array 145-b. In some examples, the second command may be offset in time from the first command. For example, the commands may be offset by at least 2.5 ns to phase switch noise of one memory array (e.g., memory array 145-a) to another memory array (e.g., memory array 145-b).

As described above, a first latch circuit 225 may be coupled to the second driver 220 and a second latch circuit 230 may be coupled to the first driver 215. The first latch circuit 225 may be configured to store second data in response to the second command. Additionally or alternatively, for example, the second latch circuit 230 may be configured to store first data in response to the first command. For example, a first command may indicate an access to the first memory array 145-a. This may result in first driver 215 driving first data line 205 with first data read from or written to at least one memory cell of the first memory array 145-a. The first command may further result in the second driver 220 driving the second data line 210 with second data stored in the first latch circuit 225. Stated alternatively, one data line (e.g., data line 205) may be activated (e.g., driven) by a read or a write cycle while another data line (e.g., data line 210) may be driven strongly by latching a previous data state. This process may be referred to as "shielding."

A second command, which may be offset in time from the first command, may result in the second driver 220 driving the second data line 210 with second data read from or written to at least one memory cell of the second memory array 145-b. This second data may be stored to the first latch circuit 225. In some cases, the first data read from or written to at least one memory cell of the first memory array 145-a may be stored to the second latch circuit 230. As described above, data may be stored to a latch circuit where it may subsequently be driven strongly to "shield" one or more data lines.

In some examples, the first command may indicate a read operation from or a write operation to at least one memory cell of the first memory array 145-a. In other examples, the second command may indicate a read operation from or a write operation to at least one memory cell of the second memory array 145-b. The second command may also indicate a read operation from or a write operation to a plurality of memory cells of the second memory array 145-b. Additionally or alternatively, for example, a third command, which may be offset in time from both the first command and the second command, may result in the second driver 220 driving the second data line 210 with third data read from at least one additional memory cell (e.g., memory cell 105 as described with reference to FIG. 1) of the second memory array 145-b or written to the at least one additional memory cell of the second memory array 145-b. Each of the first command, the second command, and the third command may be offset in time. As discussed above, each of the commands may be offset by at least 2.5 ns to phase switch noise of one memory array (e.g., memory array 145-a) to another memory array (e.g., memory array 145-b).

Figure 3:
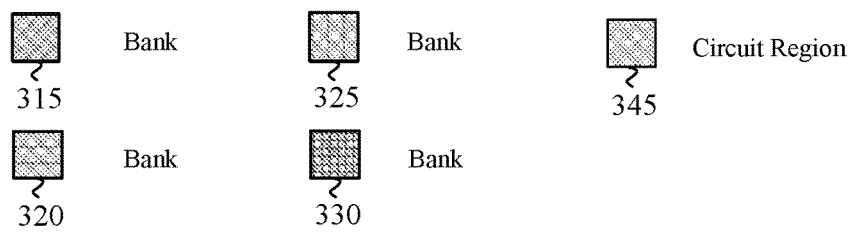
FIG. 3 illustrates an exemplary memory device that supports mitigating line-to-line capacitive coupling in a memory die in accordance with examples of the present disclosure.
Figure 3:
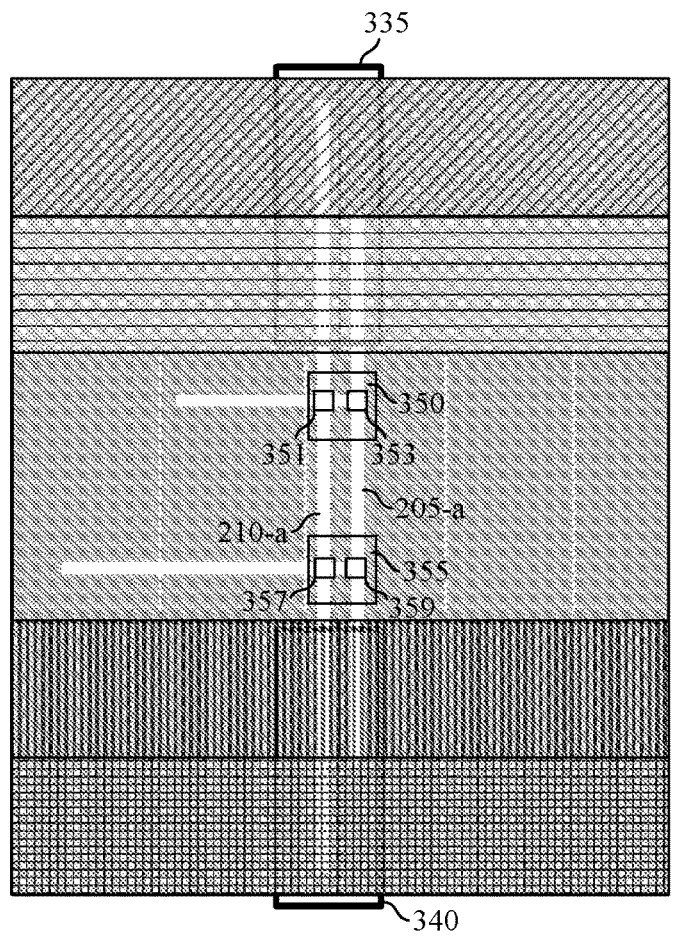

FIG. 3 illustrates an example memory device 300 in accordance with various examples of the present disclosure. Memory device 300 may include bank of memory cells 315, bank of memory cells 320, bank of memory cells 325, and bank of memory cells 330. In some examples, each of banks of memory cells 315, 320, 325, and 330 may include one or more memory arrays (e.g., memory array 145-b as described with reference to FIG. 2) that support mitigating line-to-line capacitive coupling in memory die. In some examples, each of the one or more memory arrays included in banks of memory cells 315, 320, 325, and 330 may be an example of memory array 145-a or memory array 145-b as described with reference to FIG. 2. Memory device 300 may include data line 205-a and data line 210-a and data bus coupling area 335 and data bus coupling area 340. Data line 205-a and data line 210-a may be examples of data lines 205 and 210, respectively, as described with reference to FIG. 2. Memory device 300 may, in some examples, also include circuit region 345, driver 350, and driver 355. In some examples, circuit region 345 may be referred to as peripheral circuit region 345 and each of drivers 350 and 355 may be referred to as bi-directional drivers 350 and 355.

Each of banks of memory cells 315, 320, 325, and 330 may include one or arrays more memory cells (e.g., memory array 145-a or memory array 145-b as described with reference to FIG. 2) and may each be coupled to at least one of data line 205-a or data line 210-a. Circuit region 345 may control one or more circuits (not illustrated) in electronic communication with each of banks of memory cells 315, 320, 325, and 330. In some examples, circuit region 345 may contain driver 350 and driver 355. Driver 350 may include logic region 351 and logic region 353 and driver 355 may include logic region 357 and logic region 359. For example, banks of memory cells 315 may be coupled to data line 210-a via data bus coupling area 335 and banks of memory cells 320 may be coupled to data line 205-a via data bus coupling area 335. In some examples, logic region 353 may be coupled to the first data line (e.g., data line 205-a) and may be configured to drive first data to and from at least one memory cell of the first memory array (e.g., bank of memory cells 320). In some examples, logic region 351 may be coupled to the second data line (e.g., data line 210-a) and may be configured to drive second data to and from at least one memory cell of the second memory array (e.g., bank of memory cells 315) in response to a first command indicating an access to the first memory array (e.g., bank of memory cells 320). In some examples, logic region 351 may drive first data to and from at least one memory cell of the first memory array and logic region 353 drive second data to and from at least one memory cell of the second memory array in response to a first command indicating an access to the first memory array. In other examples, banks of memory cells 315 and 320 may be coupled to data line 210-a via data bus coupling area 335. In some examples, data bus coupling area 335 may include a first driver (e.g., driver 215 as described with reference to FIG. 2) and data bus coupling area 340 may include a second driver (e.g., driver 220 as described with reference to FIG. 2).

Data line 205-a may be configured to drive first data to and from at least one memory cell of a bank to which it is coupled. For example, data line 205-a may be coupled to banks of memory cells 315 and 320 and may drive first data to and from at least one memory cell of bank of memory cells 315 or bank of memory cells 320. Data line 210-a may then be configured to drive second data to and from at least one memory cell of a bank to which it is coupled. Logic regions (e.g., logic region 351) included within driver 350 or driver 355 may indicate which bank of memory cells data is being driven to and from which bank of memory cells latched data is being driven from. For example, data line 210-a may be coupled to banks of memory cells 325 and 330 and may drive second data to and from at least one memory cell of bank of memory cells 325 or bank of memory cells 330. In some examples, data line 210-a may then drive second data in response to a first command indicating access to banks of memory cells 315 or 320. In other examples, data line 205-a may be configured to drive first data read from or written to banks of memory cells 315 or 320 in response to the first command.

Data bus coupling area 335 and data bus coupling area 340 may each contain a latch circuit (e.g., latch circuit 225 or latch circuit 230 as described with reference to FIG. 2). For example, data bus coupling area 340 may contain a latch circuit configured to store second data in response to a second command. In some examples, data bus coupling area 335 may contain a latch circuit configured to store first data in response to the first command. A first command may be issued indicating an access to at least one memory cell located in bank of memory cells 315 or bank of memory cells 320. Data line 205-a may subsequently drive data read from or written to at least one memory cell of bank of memory cells 315 or bank of memory cells 320. Data line 210-a may concurrently drive data stored in a latch circuit contained in data bus coupling area 340. This may result in the shielding of data line 205-a.

Subsequent to a first command, for example, a second command may be issued, which may result in data line 210-a driving data read from or written to at least one memory cell of bank of memory cells 325 or bank of memory cells 330. This data may be stored to a latch circuit contained in data bus coupling area 340. As described above, the data stored to a latch circuit (e.g., stored in data bus coupling area 340) may eventually be driven strongly as to shield one or more data lines (e.g., data line 205-*a*). Additionally or alternatively, for example, the second command may result in data line 205-*a* storing data read from at least one memory cell of bank of memory cells 315 or bank of memory cells 320 to a latch circuit contained in data bus coupling area 335.

Each of the first command and the second command may be offset in time. For example, the first command may indicate a read operation from or a write operation to at least one memory cell of bank of memory cells 315 or bank of memory cells 320. In some examples, the second command may indicate a read operation from or a write operation to at least one memory cell of bank of memory cells 325 or bank of memory cells 330.

Figure 4:
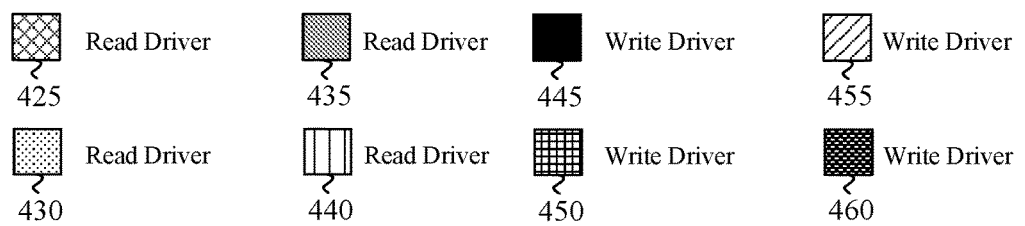
FIG. 4 illustrates an exemplary memory device that supports mitigating line-to-line capacitive coupling in a memory die in accordance with examples of the present disclosure.
Figure 4:
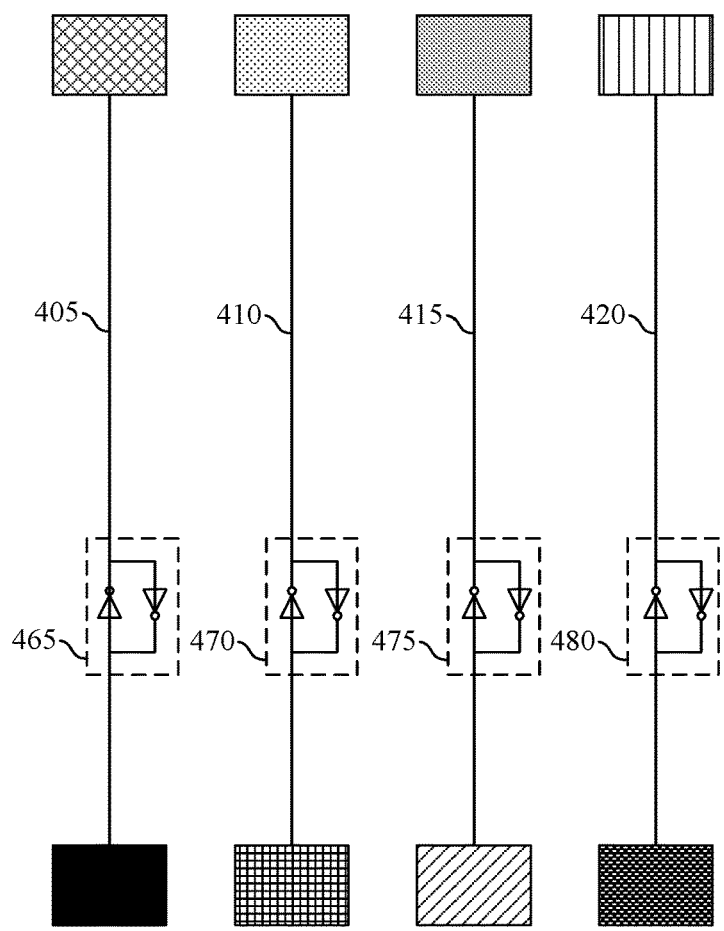

FIG. 4 illustrates an example memory device 400 in accordance with various examples of the present disclosure. Memory device 400 may include read driver 425, read driver 430, read driver 435, and read driver 440 that support mitigating line-to-line capacitive coupling in memory die. In some examples, read drivers 425 and 435 may be a same read driver and read drivers 430 and 440 may be a same read driver, while in other examples at least some of these read drivers may each be different from each other. Memory device may include write driver 445, write driver 450, write driver 455, and write driver 460. In some examples, write drivers 445 and 455 may be a same write driver and write drivers 450 and 460 may be a same write driver, while in other examples at least some of these write drivers may each be different from each other. In other examples, memory device 400 may include data line 405, data line 410, data line 415, and data line 420 and latch circuit 465, latch circuit 470, latch circuit 475 and latch circuit 480. In some examples, data lines 405 and 415 may be a same data line and data lines 410 and 420 may be a same data line. In other examples, latch circuits 465 and 475 may be a same latch circuit and latch circuits 470 and 480 may be a same latch circuit.

In some examples, data lines 405 and 415 may be coupled to a first bank of memory cells (e.g., bank of memory cells 315 as described with reference to FIG. 3) and data lines 410 and 420 may be coupled to a second bank of memory cells (e.g., bank of memory cells 320 as described with reference to FIG. 3). Each of the banks of memory cells may include one or arrays more memory cells (e.g., memory array 145-*a* or memory array 145-*b* as described with reference to FIG. 2).

Each of data lines 405, 410, 415, and 420 may be configured to drive first data to and from at least one memory cell of a bank to which it is coupled. For example, each of data lines 405 and 415 may be coupled a first bank of memory cells (e.g., bank of memory cells 315 as described with reference to FIG. 3) and may drive first data to and from at least one memory cell of the bank of memory cells. Each of data lines 410 and 420 may then be configured to drive second data to and from at least one memory cell of a bank to which it is coupled. For example, write drivers 445 and 455 may be activated to drive first data to and from at least one memory cell of the first memory array via data lines 405 and 415 in response to a first command indicating an access to the first memory array, respectively. At this time, for example, either read drivers 430 and 440 or write drivers 450 or 460 may be activated to fix potential levels of data lines 410 and 420, respectively.

In some examples, data lines 405, 410, 415, and 420 may drive data stored in latch circuits 465, 470, 475, and 480, respectively. In some examples, each of data lines 405 and 415 may be coupled latch circuit 465 and latch circuit 475, respectively, and may be configured to drive second data stored in each of the latch circuits in response to the first command.

For example, write drivers 445 and 455 may be activated to drive first data to and from at least one memory cell of the first memory array via data lines 405 and 415, respectively, in response to a first command indicating an access to the first memory array. Either read drivers 430 and 440 or write drivers 450 and 460 may then be activated to drive second data, via data lines 410 and 420, respectively, to and from at least one memory cell of the second memory array in response to a second command indicating an access to the second memory array. This second data may be stored to latch circuits 470 and 480, respectively. Subsequently, either read drivers 430 and 440 or write drivers 450 and 460 may drive the second data stored to latch circuits 470 and 480 in response to the first command. The first command may be offset in time from the second command.

Figure 5:
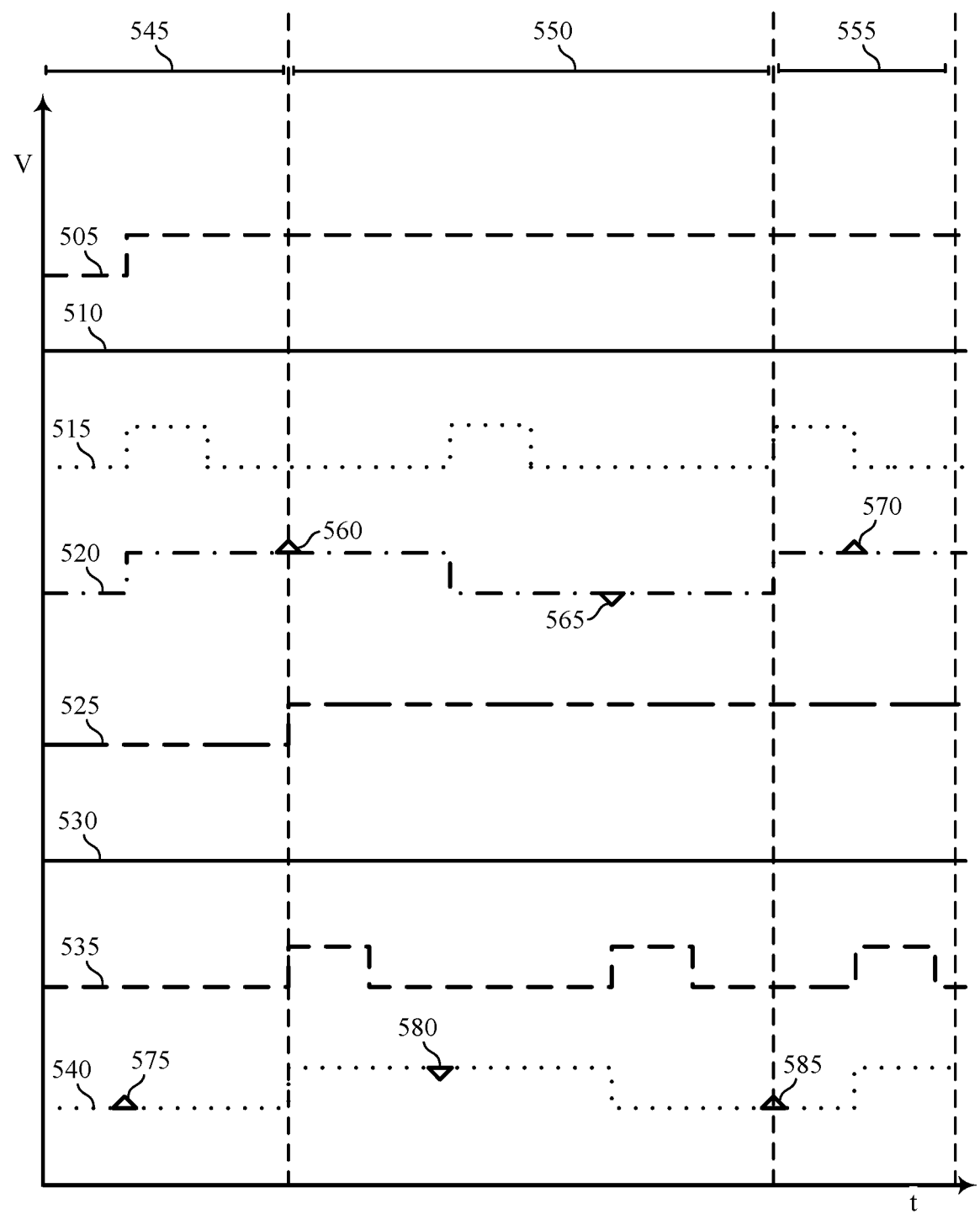
FIG. 5 illustrates a timing diagram for operating a memory device that supports mitigating line-to-line capacitive coupling in a memory die in accordance with examples of the present disclosure.

FIG. 5 illustrates an example of a timing diagram 500 for operating a memory device that supports mitigating line-to-line coupling in memory die. Timing diagram may include write enable signal 505, read enable signal 510, sample signal 515, data signal 520, write enable signal 525, read enable signal 530, sample signal 535, and data signal 540. Write enable signal 505, read enable signal 510, sample signal 515, and data signal 520 may represent read and write operations performed on a first bank of memory cells (e.g., bank of memory cells 315 as described with reference to FIG. 3). Write enable signal 525, read enable signal 530, sample signal 535, and data signal 540 may represent read and write operations performed on a second bank of memory cells (e.g., bank of memory cells 320 as described with reference to FIG. 3). Timing diagram 500 may result from operating memory device 200 as described with reference to FIG. 2, and the following discussion is in the context of components depicted in FIG. 1 through FIG. 3, among other aspects, in accordance with various aspects of the present disclosure.

As discussed above, a first data line may be activated (e.g., driven with first data read from at least one memory cell of a first memory array or written to the at least one memory cell of the first memory array). In some examples, this may occur in response to a first command indicating an access to the first memory array. A second data line may be activated (e.g., driven with second data stored in a first latch circuit). In some examples, this may occur in response to the first command and is an example of the second data line shielding the first data line. The aforementioned operations may be an example of activating (e.g., driving) a first and second data line that are in electronic communication with one or more banks of memory cells (e.g., banks of memory cells 315, 320, 325, and 330 as described with reference to FIG. 3).

At time interval 545, a write operation may be performed on a first bank of memory cells (e.g., bank of memory cells 315 as described with reference to FIG. 3). This may correspond to an increased voltage in write enable signal 505. At the onset of the write operation, data signal 520 may begin writing data to at least one memory cell (e.g., memory cell 150 as described with reference to FIG. 1) of the first bank of memory cells. For example, when the voltage of sample signal 515 increases, data may be activated (e.g., driven with first data read from at least one memory cell of a first memory array or written to the at least one memory cell of the first memory array), as indicated by the increased voltage of data signal 520. During this write operation, at time interval 545, read enable signal 510 may remain at a constant, lower voltage as compared to write enable signal 505.

Additionally or alternatively, for example, transitioning a write operation from a first bank of memory cells to a second bank of memory cells may result in parasitic capacitance (e.g., capacitive coupling) between the data lines in communication with the first and second banks of memory cells. In some examples, the capacitive coupling may be minimized by using a write driver of the secondary line to hold the value of the corresponding data line. For example, time 575 may represent an access to a first bank of memory cells and time 560 may represent an access to a second bank of memory cells. At time 575 a second data line may be driven to minimize a capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3). In other examples, at time 560, a first data line may be driven to minimize capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3).

At a point of time interval 550 (e.g., in some cases, at a beginning of time interval 550), for example, a write operation may transition from a first bank of memory cells (e.g., bank of memory cells 315 as described with reference to FIG. 3) to a second bank of memory cells (e.g., bank of memory cells 320 as described with reference to FIG. 3), from the second bank of memory cells back to the first bank of memory cells, and from the first bank of memory cells back to the second bank of memory cells. At the onset of the write operation, data signal 540 may begin writing data to at least one memory cell (e.g., memory cell 150 as described with reference to FIG. 1) of the second bank of memory cells. For example, when the voltage of sample signal 535 increases, data may be driven—indicated by the increased voltage of data signal 540. This may represent a write operation to a second bank of memory cells.

Additionally or alternatively, for example, when the voltage of sample signal 515 increases, data may be driven in an opposite direction—indicated by the decreased voltage of data signal 520. During this write operation, at time interval 550, read enable signal 510 may remain at a constant, lower voltage as compared to write enable signal 505. This may represent a write operation transitioning from a second bank of memory cells to a first bank of memory cells. In other examples, when the voltage of sample signal 535 increases for a second time during time interval 550, data may be again driven in an opposite direction indicated by the decreased voltage of data signal 540. During this write operation, read enable signal 530 may remain at a constant, lower voltage as compared to write enable signal 525. This may represent a write operation transitioning from a first bank of memory cells back to a second bank of memory cells.

As discussed above, in some examples, capacitive coupling between a first data line and a second data line may be minimized by using a write driver to hold the value of the corresponding data line. Additionally or alternatively, for example, at time 580, a write operation may transition from the second bank of memory cells to the first bank of memory cells. At time 580, a second data line may be driven to minimize capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3). In other examples, at time 565, a write operation may transition from the first bank of memory cells to the second bank of memory cells. At the time 565, a first data line may be driven to minimize capacitive coupling between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3).

At the onset of time interval 555, for example, a write operation may again transition from a second bank of memory cells (e.g., bank of memory cells 320 as described with reference to FIG. 3) back to a first bank of memory cells (e.g., bank of memory cells 315 as described with reference to FIG. 3). For example, a write operation may be performed on a first bank of memory cells. At the onset of the write operation, data signal 520 may begin writing data to at least one memory cell (e.g., memory cell 150 as described with reference to FIG. 1) of the first bank of memory cells. In some examples, time 585 may represent an access to a first bank of memory cells and time 570 may represent an access to a second bank of memory cells. At time 585 a second data line may be driven to minimize a capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3).

For example, when the voltage of sample signal 515 increases, data may be driven—indicated by the increased voltage of data signal 520. Additionally or alternatively, for example, when the voltage of sample signal 535 increases, data may be driven in an opposite direction—indicated by the increased voltage of data signal 540. During this write operation, at time interval 555, read enable signal 510 may remain at a constant, lower voltage as compared to write enable signal 505. As discussed above, in some examples, capacitive coupling noise between a first data line and a second data may be minimized by using a write driver to hold the value of the corresponding data line. In each of these examples, parasitic capacitance between each data line may exist. Capacitive coupling noise therebetween may be minimized by using the write driver of the opposite line to maintain the voltage.

Figure 6:
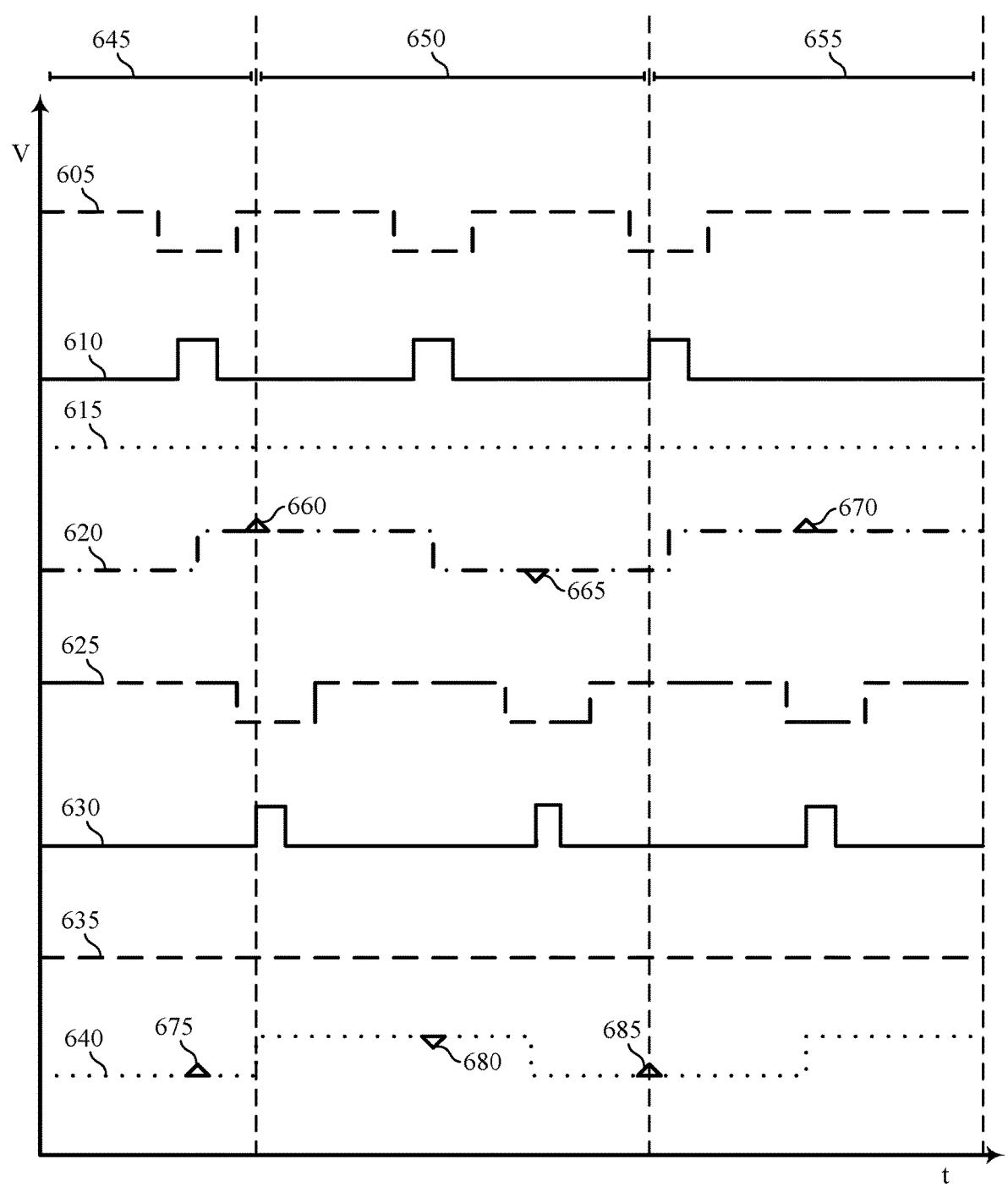
FIG. 6 illustrates a timing diagram for operating a memory device that supports mitigating line-to-line capacitive coupling in a memory die in accordance with examples of the present disclosure.

FIG. 6 illustrates an example of a timing diagram 600 for operating a memory device that supports mitigating line-to-line capacitive coupling in a memory die. Timing diagram may include write enable signal 605, read enable signal 610, sample signal 615, data signal 620, write enable signal 625, read enable signal 630, sample signal 635, and data signal 640. Write enable signal 605, read enable signal 610, sample signal 615, and data signal 620 may represent read and write operations performed on a first bank of memory cells (e.g., bank of memory cells 315 as described with reference to FIG. 3). Write enable signal 625, read enable signal 630, sample signal 635, and data signal 640 may represent read and write operations performed on a second bank of memory cells (e.g., bank of memory cells 320 as described with reference to FIG. 3). Timing diagram 600 may result from operating memory device 200 as described with reference to FIG. 2, and the following discussion is in the context of components depicted in FIG. 1 through FIG. 3, among other aspects, in accordance with various aspects of the present disclosure.

At time interval 645, a read operation may be performed on a first bank of memory cells (e.g., bank of memory cells 315 as described with reference to FIG. 3). This may correspond to an increased voltage in read enable signal 610 and a decreased voltage in write enable signal 605. At the onset of the read operation, data signal 620 may be read out from at least one memory cell (e.g., memory cell 150 as described with reference to FIG. 1) of the first bank of memory cells. For example, when the voltage of read enable signal 610 increases, data may be driven. During this read operation, at time interval 645, sample signal 615 may remain at a constant, lower voltage as compared to read enable signal 610. During this operation, for example, when reading from a first bank of memory cells, the write driver for the second bank of memory cells may drive data strongly as to minimize capacitive coupling noise between the first data line and the second data line. In some examples, the driven data by the second data line is not written to the second bank of memory cells. In some examples, the capacitive coupling noise may be minimized by using a write driver of the secondary line to hold the value of the corresponding data line. For example, time 675 may represent driving a second data line to minimize the capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3). In other examples, time 660 may represent a read operation performed on a second bank of memory cells. At time 660 a first data line may be driven to minimize capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3).

At the onset of time interval 650, a read operation may transition from a first bank of memory cells (e.g., bank of memory cells 315 as described with reference to FIG. 3) to a second bank of memory cells (e.g., bank of memory cells 320 as described with reference to FIG. 3). This may be indicated by an increased voltage in read enable signal 630, an increased voltage in write enable signal 605, and a decreased voltage in write enable signal 625. At the onset of the read operation, data signal 640 may be read out from at least one memory cell (e.g., memory cell 150 as described with reference to FIG. 1) of the second bank of memory cells. During this read operation, at time interval 650, sample signal 635 may remain at a constant, lower voltage as compared to read enable signal 630. During this operation, for example, when reading from a second bank of memory cells, the write driver for the first bank of memory cells may drive data strongly as to minimize capacitive coupling between the first data line and the second data line.

As discussed above, in some examples, capacitive coupling between a first data line and a second data may be minimized by using a write driver of the secondary line to hold the value of the corresponding data line. For example, time 680 may represent a read operation being performed on a first bank of memory cells. At time 680, a second data line may be driven to minimize capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3). In other examples, time 665 may represent a read operation performed on a second bank of memory cells and at the time 665. At time 665, a first data line may be driven to minimize capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3).

Similarly, for example, at the onset of time interval 655, a read operation may transition from a second bank of memory cells (e.g., bank of memory cells 320 as described with reference to FIG. 3) back to a first bank of memory cells (e.g., bank of memory cells 315 as described with reference to FIG. 3). This may be indicated by an increased voltage in data signal 620 and a decreased voltage in data signal 640. At the onset of the read operation, data signal 620 may be read out from at least one memory cell (e.g., memory cell 150 as described with reference to FIG. 1) of the first bank of memory cells. This may occur at, for example, time 670. During this read operation, at time interval 655, sample signal 615 may remain at a constant, lower voltage as compared to read enable signal 610. As discussed above, in some examples, capacitive coupling noise between a first data line and a second data may be minimized by using a write driver of the secondary line to hold the value of the corresponding data line. For example, time 685 may represent a read operation performed on a first bank of memory cells. At time 685, a second data line may be driven to minimize capacitive coupling noise between a first data line in communication with a first bank of memory cells (e.g., bank of memory cells 315 as described with reference to FIG. 3) and a second data line in communication with a second bank of memory cells (e.g., bank of memory cells 320 as described with reference to FIG. 3). In each of these examples, parasitic capacitance between each data line may exist. The capacitive coupling noise therebetween may be minimized by using the write driver of the opposite line to maintain the voltage.

Figure 7:
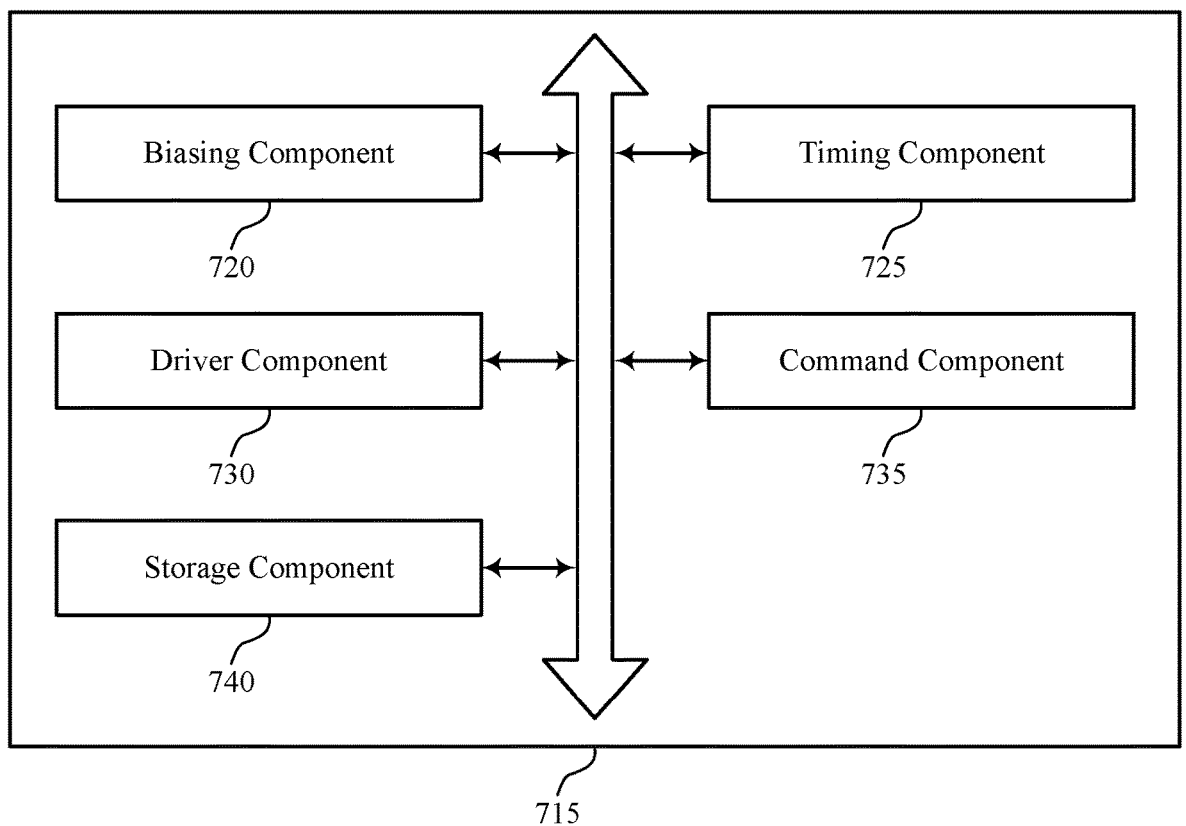
FIG. 7 illustrates an exemplary memory device that supports mitigating line-to-line capacitive coupling in a memory die in accordance with examples of the present disclosure.

FIG. 7 shows a block diagram 700 of a memory controller 715 that supports mitigating line-to-line capacitive coupling in a memory die in accordance with examples of the present disclosure. The memory controller 715 may be an example of aspects of a memory controller 140 as described with reference to FIG. 1. The memory controller 715 may include biasing component 720, timing component 725, driver component 730, command component 735, and storage component 740. Each of these modules may communicate, directly or indirectly, with one another (e.g., via one or more buses).

Driver component 730 may activate a driver (e.g., driver 215 or driver 220 as described with reference to FIG. 2) to drive one or more data lines (e.g., data line 205 or data line 210 as described with reference to FIG. 2) with data. For example, the driver component 730 may activate a first driver (e.g., driver 215 as described with reference to FIG. 2) to drive a first data line (e.g., data line 205 as described with reference to FIG. 2) with first data read from at least one memory cell of a first memory array (e.g., memory array 145-a as described with reference to FIG. 2) in response to a first command indicating access to the first memory array. In other examples, the driver component 730 may activate a second driver (e.g., driver 220 as described with reference to FIG. 2) to drive a second data line (e.g., data line 210 as described with reference to FIG. 2) with second data stored in a first latch circuit (e.g., latch circuit 225 as described with reference to FIG. 2) in response to the first command.

Driver component 730 may activate a driver (e.g., driver 220 as described with reference to FIG. 2) to drive a second data line (e.g., data line 210 as described with reference to FIG. 2) with second data read from at least one memory cell of a second memory array (e.g., memory array 145-b as described with reference to FIG. 2) in response to a second command. Driver component 730 may activate a driver to store second data to a first latch circuit (e.g., latch circuit 225 as described with reference to FIG. 2).

In some examples, the driver component 730 may activate a driver (e.g., driver 220 as described with reference to FIG. 2) to drive a second data line (e.g., data line 210 as described with reference to FIG. 2) with third data read from at least one additional memory cell of a second memory array (e.g., memory array 145-b as described with reference to FIG. 2) in response to a third command. Driver component 730 may drive a first data line (e.g., data line 205 as described with reference to FIG. 2) with first data stored in a second latch circuit (e.g., latch circuit 230 as described with reference to FIG. 2) in response to the third command.

Command component 735 may issue each of a first command, second command, or third command as described with reference to the driver component 730. For example, the command component 735 may issue a first command that may indicate an access to a first memory array (e.g., memory array 145-a as described with reference to FIG. 2). The first command issued by the command component 735 may, for example, result in the driver component 730 driving first data to and from at least one memory cell of the first memory array. In some examples, the first command issued by command component 735 may result in the driver component 730 driving second data to and from at least one memory cell of a second memory array (e.g., memory array 145-b as described with reference to FIG. 2).

In some examples, the command component 735 may issue a second command that may result in driver component 730 driving the second data line (e.g., data line 210 as described with reference to FIG. 2) with second data read from or written to at least one memory cell of a second memory array (e.g., memory array 145-b as described with reference to FIG. 2). In some examples, the second command issued by the command component 735 may result in the storing of the second data to a first latch circuit (e.g., latch circuit 230 as described with reference to FIG. 2).

In some examples, the command component 735 may issue a third command that may result in driver component 730 driving the second data line with third data read from at least one additional memory cell of the second memory array or written to the at least one additional memory cell of the second memory array. In other examples, the third command issued by the command component 735 may result in the driver component 730 driving the first data line with first data stored in the second latch circuit.

Each of the first command, the second command, and the third commands issued by the command component 735 may be offset in time. In some examples, the first command may indicate a read operation from or a write operation to at least one memory cell of the first memory array. In other examples, the second command may indicate a read operation form or a write operation to the at least one memory cell of the second memory array. Additionally or alternatively, for example, the third command may indicate a read operation from or a write operation to at least one additional memory cell of the second memory array.

Figure 8:
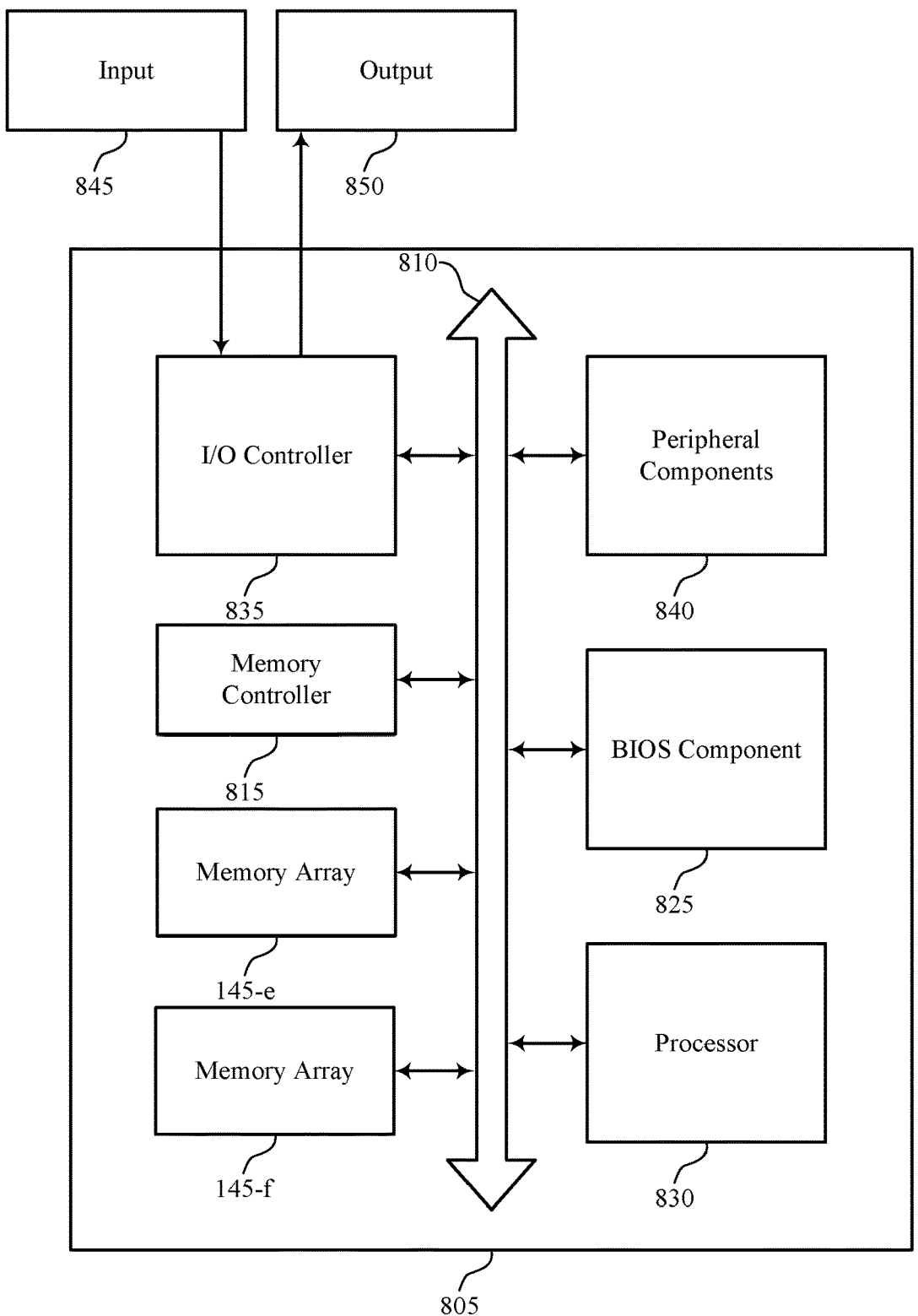
FIG. 8 illustrates an exemplary memory device that supports mitigating line-to-line capacitive coupling in a memory die in accordance with examples of the present disclosure.

FIG. 8 shows a diagram of a system 800 including a device 805 that supports mitigating line-to-line capacitive coupling in a memory die in accordance with examples of the present disclosure. Device 805 may be an example of or include the components of memory device 200 as described above, e.g., with reference to FIG. 2. Device 805 may include components for bi-directional voice and data communications including components for transmitting and receiving communications, including memory controller 815, memory array 145-e, memory array 145-f, basic input/output system (BIOS) component 825, processor 830, I/O controller 835, and peripheral components 840. These components may be in electronic communication via one or more buses (e.g., bus 810).

Memory arrays 145-e and 145-f may be examples of memory arrays 145-a and 145-b, respectively, as described with reference to FIG. 2. For example, each of memory arrays 145-e and 145-f may be coupled to a data line (e.g., data line 205 and data line 210 as described with reference to FIG. 2), and a driver (e.g., driver 215 and driver 220 as described with reference to FIG. 2). Each of the drivers may be coupled to a latch circuit (e.g., latch circuit 225 and latch circuit 230 as described with reference to FIG. 2).

BIOS component 825 be a software component that includes BIOS operated as firmware, which may initialize and run various hardware components. BIOS component 825 may also manage data flow between a processor and various other components, e.g., peripheral components, input/output control component, etc. BIOS component 825 may include a program or software stored in read only memory (ROM), flash memory, or any other non-volatile memory.

Processor 830 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 830 may be configured to operate a memory array using a memory controller. In other cases, a memory controller may be integrated into processor 830. Processor 830 may be configured to execute computer-readable instructions stored in a memory to perform various functions (e.g., functions or tasks supporting mitigating line-to-line capacitive coupling in a memory die).

I/O controller 835 may manage input and output signals for device 805. I/O controller 835 may also manage peripherals not integrated into device 805. In some cases, I/O controller 835 may represent a physical connection or port to an external peripheral. In some cases, I/O controller 835 may utilize an operating system such as iOS®, ANDROID®, MS-DOS®, MS-WINDOWS®, OS/2®, UNIX®, LINUX®, or another known operating system. In other cases, I/O controller 835 may represent or interact with a modem, a keyboard, a mouse, a touchscreen, or a similar device. In some cases, I/O controller 835 may be implemented as part of a processor. In some cases, a user may interact with device 805 via I/O controller 835 or via hardware components controlled by I/O controller 835.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 845 may represent a device or signal external to device 805 that provides input to device 805 or its components. This may include a user interface or an interface with or between other devices. In some cases, input 845 may be managed by I/O controller 835, and may interact with device 805 via a peripheral component 840.

Output 850 may also represent a device or signal external to device 805 configured to receive output from device 805 or any of its components. Examples of output 850 may include a display, audio speakers, a printing device, another processor or printed circuit board, etc. In some cases, output 850 may be a peripheral element that interfaces with device 805 via peripheral component(s) 840. In some cases, output 850 may be managed by I/O controller 835

The components of device 805 may include circuitry designed to carry out their functions. This may include various circuit elements, for example, conductive lines, transistors, capacitors, inductors, resistors, amplifiers, or other active or inactive elements, configured to carry out the functions described herein. Device 805 may be a computer, a server, a laptop computer, a notebook computer, a tablet computer, a mobile phone, a wearable electronic device, a personal electronic device, or the like. Or device 805 may be a portion or aspect of such a device.

Figure 9:
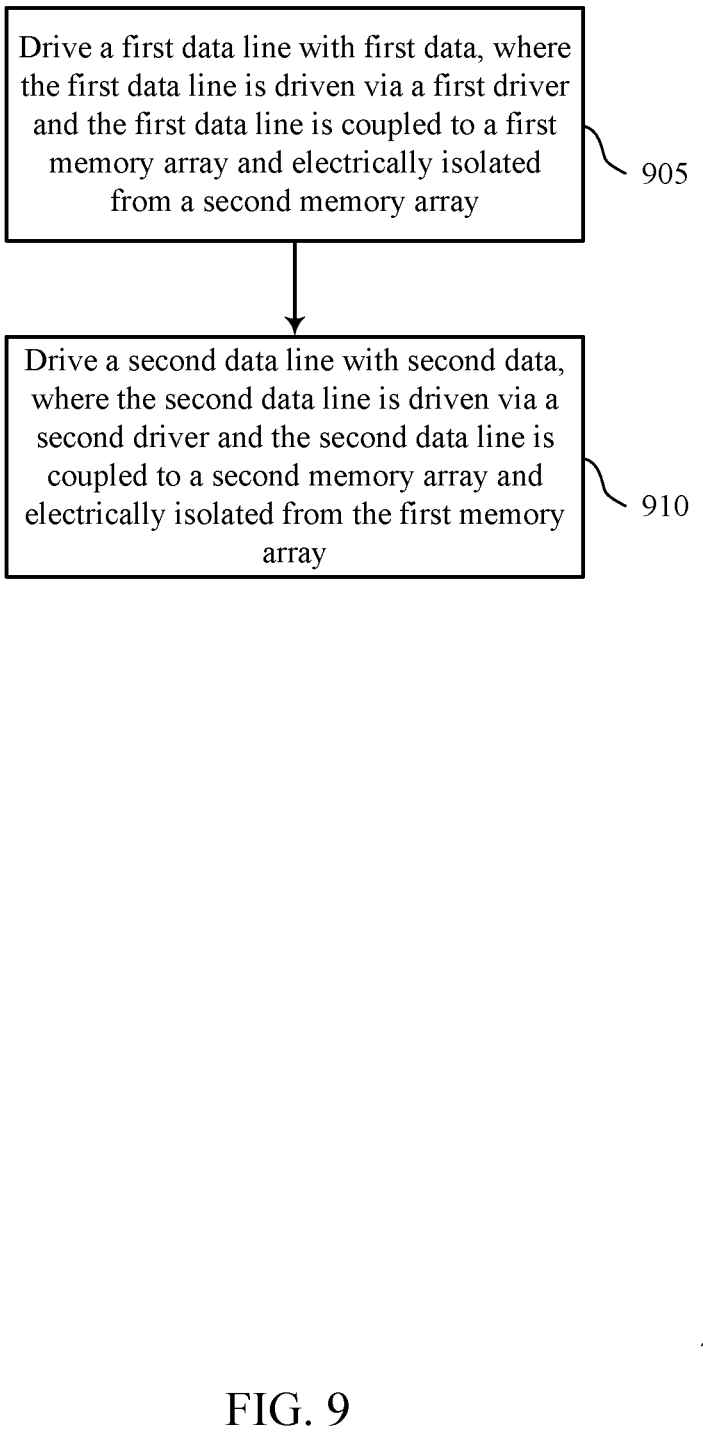
FIG. 9 is a flowchart that illustrates a method or methods for mitigating line-to-line capacitive coupling in a memory die in accordance with examples of the present disclosure.

FIG. 9 shows a flowchart illustrating a method 900 for methods of mitigating line-to-line capacitive coupling in a memory die in accordance with examples of the present disclosure. The operations of method 900 may be implemented by a memory controller (e.g., memory controller 715 as described with reference to FIG. 7) or its components as described herein. In some examples, a memory controller may execute a set of codes to control the functional elements of the device to perform the functions described below. Additionally or alternatively, the memory controller may perform aspects of the functions described below using special-purpose hardware.

At block 905 the memory controller may drive a first data line with first data read from at least one memory cell of a first memory array or written to the at least one memory cell of the first memory array in response to a first command. The first command may indicate an access to the first memory array and the first data line may be driven via a first driver. In some examples, the first data line may be coupled to the first memory array and may be electrically isolated from a second memory array. The operations of block 905 may be performed according to the methods described herein. In certain examples, aspects of the operations of block 905 may be performed by a memory controller 715 as described with reference to FIG. 7.

At block 910 the memory controller may drive a second data line with second data stored in a first latch circuit in response to the first command. The second data line may be driven via a second driver coupled to the first latch circuit and the second data line may be coupled to the second memory array and electrically isolated from the first memory array. The operations of block 910 may be performed according to the methods described herein. In certain examples, aspects of the operations of block 910 may be performed by a memory controller 715 as described with reference to FIG. 7.

In additional examples, the first command may indicate a read operation from or a write operation to the at least one memory cell of the first memory array. Additionally or alternatively, for example, the second command may indicate a read operation from or a write operation to the at least one memory cell of the second memory array. In some examples, the method may include storing the first data read from the at least one memory cell of the first memory array or written to the at least one memory cell of the first memory array to a second latch circuit coupled to the first driver.

In other examples, the method may include driving the second data line with third data read from at least one additional memory cell of the second memory array or written to the at least one additional memory cell of the second memory array in response to a third command. Additionally or alternatively, the method may include driving the first data line with the first data stored in the second latch circuit in response to the third command. In some examples, each of the first command, the second command, and the third command may be offset in time.

It should be noted that the methods described above describe possible implementations, and that the operations and the steps may be rearranged or otherwise modified and that other implementations are possible. Furthermore, examples from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially," as may be used in this disclosure in the claims, means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

The term "isolated" refers to a relationship between components in which electrons are not presently capable of flowing between them; components are isolated from each other if there is an open circuit between them. For example, two components physically connected by a switch may be isolated from each other when the switch is open.

As may be used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. In some examples, the substrate may be an organic build up substrate formed from materials such as ABF or BT. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a first driver configured to drive first data from at least one memory cell of a memory array at a first drive strength in response to a first command, wherein the first driver is coupled with a first access line; and
a second driver configured to drive second data from a latch coupled with a second access line at a second drive strength that is different than the first drive strength in response to a second command that is offset in time from the first command, wherein the second driver is configured to drive the second data at the second drive strength to reduce capacitive coupling caused by driving the first data.

2. The apparatus of claim 1, further comprising:
a second memory array coupled with the second access line, wherein the second driver is configured to drive the second data to the latch in response to a third command that is issued before the first command, wherein the second data is driven from at least one memory cell of the second memory array.

3. The apparatus of claim 2, further comprising:
a second latch coupled with the first access line, wherein the first driver is configured to drive the first data to the second latch based at least in part on receiving the first command.

4. The apparatus of claim 1, wherein the first access line is driven at a first voltage and the second access line is driven at a second voltage different from the first voltage.

5. The apparatus of claim 4, wherein the second voltage is greater than the first voltage, and wherein the second access line is configured to shield the first access line when the first driver and the second driver are activated.

6. The apparatus of claim 1, wherein the first driver and the second driver are configured to be activated at a same time.

7. The apparatus of claim 1, wherein the first access line is electrically isolated from the second access line.

8. The apparatus of claim 1, wherein the memory array is electrically isolated from a second memory array coupled with the second access line.

9. A method, comprising:
activating a first driver to drive first data from at least one memory cell of a first memory array at a first drive strength in response to receiving a first command, wherein the first driver is coupled with a first access line; and
activating a second driver to drive second data from a latch coupled with a second access line to at least one memory cell of a second memory array coupled with the second access line at a second drive strength that is different than the first drive strength in response to receiving a second command that is offset in time from the first command, wherein activating the second driver to drive the second data at the second drive strength reduces capacitive coupling caused by driving the first data.

10. The method of claim 9, further comprising:
latching the first data to a second latch coupled with the first access line in response to receiving the second command; and
deactivating the first driver and the second driver based at least in part on latching the first data to the second latch.

11. The method of claim 10, further comprising:
activating the second driver to drive third data from the at least one memory cell of the second memory array in response to receiving a third command; and
activating the first driver to drive the first data from the second latch based at least in part on receiving the third command.

12. The method of claim 11, wherein the second data and the third data are associated with a same row of memory cells of the second memory array.

13. The method of claim 9, wherein the second access line is configured to shield the first access line when the first driver and the second driver are activated.

14. The method of claim 9, wherein the first driver and the second driver are each activated during a same duration.

15. An apparatus, comprising:
a first driver coupled with a first access line and a first memory array;
a second driver coupled with a second access line, a latch, and a second memory array; and
a memory controller coupled with the first driver and the second driver, wherein the memory controller is operable to: activate the first driver to drive first data from the first memory array at a first drive strength in response to receiving a first command; and
activate the second driver to drive second data from the latch to at least one memory cell of the second memory array coupled with the second access line at a second drive strength that is different than the first drive strength in response to receiving a second command that is offset in time from the first command, wherein activating the second driver to drive the second data at the second drive strength reduces capacitive coupling caused by driving the first data.

16. The apparatus of claim 15, wherein the memory controller is further operable to:
latch the second data before activating the first driver, wherein the second data is associated with at least one memory cell of the second memory array.

17. The apparatus of claim 15, wherein the memory controller is further operable to:
latch the first data to a second latch coupled with the first access line in response to receiving the second command;
activating the second driver to drive third data to and from at least one memory cell of the second memory array in response to receiving a third command; and
activating the first driver to drive the first data from the second latch based at least in part on receiving the third command.

18. The apparatus of claim 17, wherein at least one of the first command, the second command, and the third command comprises a read enable signal, and at least one of the first command, the second command, and the third command comprises a write enable signal.

19. The apparatus of claim 15, wherein the memory controller is further operable to activate the first driver and the second driver concurrently.

20. The apparatus of claim 15, wherein the memory controller is further operable to offset the activation of the first driver and the second driver.

* * * * *